(12) United States Patent
Hong et al.

(10) Patent No.: US 8,287,745 B2
(45) Date of Patent: Oct. 16, 2012

(54) METHOD FOR FABRICATING PROBE TIP

(75) Inventors: Ki Pil Hong, Gyeonggi-do (KR); Jong Hyeon Chae, Seoul (KR); Hac Ju Lee, Chungcheongbuk-do (KR)

(73) Assignee: M2N Inc. (KR)

( * ) Notice: Subject to any disclaimer, the term of this patent is extended or adjusted under 35 U.S.C. 154(b) by 442 days.

(21) Appl. No.: 12/601,608

(22) PCT Filed: May 29, 2008

(86) PCT No.: PCT/KR2008/003014
§ 371 (c)(1),
(2), (4) Date: Nov. 24, 2009

(87) PCT Pub. No.: WO2008/147119
PCT Pub. Date: Dec. 4, 2008

(65) Prior Publication Data
US 2010/0163518 A1 Jul. 1, 2010

(30) Foreign Application Priority Data
May 30, 2007 (KR) .................. 10-2007-0052885

(51) Int. Cl.
*C23F 1/00* (2006.01)
*G01Q 70/16* (2010.01)
(52) U.S. Cl. ............... 216/11; 850/32; 850/40; 850/45; 850/48; 850/60
(58) Field of Classification Search .................. None
See application file for complete search history.

(56) References Cited

U.S. PATENT DOCUMENTS

| | | | | |
|---|---|---|---|---|
| 7,370,515 B2 * | 5/2008 | Okulan et al. | ............. | 73/105 |
| 7,736,690 B2 * | 6/2010 | Hirakawa et al. | ............. | 427/58 |
| 7,767,101 B2 * | 8/2010 | Park et al. | ............. | 216/11 |
| 7,891,090 B2 * | 2/2011 | Yakabe et al. | ............. | 29/842 |
| 7,990,165 B2 * | 8/2011 | Aoyagi et al. | ............. | 324/754.03 |
| 2005/0092709 A1 | 5/2005 | Chun et al. | | |

FOREIGN PATENT DOCUMENTS

| | | | |
|---|---|---|---|
| JP | 2006222309 A | * | 8/2006 |
| JP | 2006-300617 A | | 11/2006 |
| KR | 10066443 B1 | | 12/2006 |

OTHER PUBLICATIONS

International Search Report, PCT/KR2008/003014, dated Oct. 30, 2008.

* cited by examiner

*Primary Examiner* — Allan Olsen
(74) *Attorney, Agent, or Firm* — Cantor Colburn LLP

(57) ABSTRACT

Disclosed is a method for fabricating a probe tip, capable of preventing a rapid increase of a surface size of a front end of the probe tip as the probe tip is worn out by a frequent contact with a wafer chip and, also, capable of improving the precision of the front end of the probe tip. The method for fabricating a probe tip includes forming a front end of the probe tip on a silicon wafer; forming a first protective layer which is patterned to expose a part of the front end of the probe tip; and forming a body of the probe tip in a portion opened by the pattern of the first protective layer.

19 Claims, 7 Drawing Sheets

METHOD FOR FABRICATING PROBE TIP

TECHNICAL FIELD

The present disclosure relates to a method for fabricating a probe tip; and more particularly, to a method for fabricating a probe tip of a probe card for use in testing a semiconductor device.

BACKGROUND ART

In general, a probe card is an apparatus to be used in testing semiconductor devices such as a semiconductor memory, a display and the like during or after a manufacturing process thereof. In particular, the probe card electrically connects a wafer with a semiconductor test apparatus to transmit electrical signals from the semiconductor test apparatus to the semiconductor devices formed on the wafer and, also, to transmit response signals from the semiconductor devices to the semiconductor test apparatus so that the semiconductor devices can be tested.

The probe card includes a plurality of probe tips. Recently, as the size of the semiconductor device is getting smaller, the size of pads on a wafer chip and the distance (pitch) between the pads are also getting smaller. Therefore, various researches and developments are being actively conducted to miniaturize the probe tip which is brought into contact with the wafer chip.

FIGS. 1 to 9 are cross sectional views for describing a conventional procedure for fabricating a probe tip.

Figure 1:
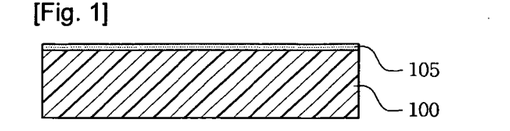
FIGS. 1 to 9 are cross sectional views for describing a conventional procedure for fabricating a probe tip.

First, as shown in FIG. 1, a silicon nitride film 105 is formed on a silicon wafer 100.

Figure 2:
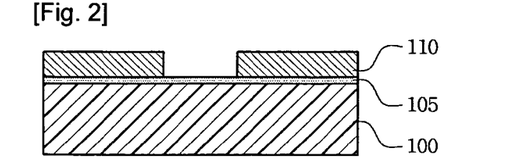

Next, as shown in FIG. 2, a patterned photoresist layer 110 is formed on the silicon nitride film 105. At this time, the photoresist layer 110 is exposed by means of an ultraviolet exposure device or the like by using a mask layer (not shown) having a predefined pattern for forming the probe tip, and then a development process is performed on the exposed photoresist layer, so that the photoresist layer 110 can be patterned according to the pattern of the mask.

Figure 3:
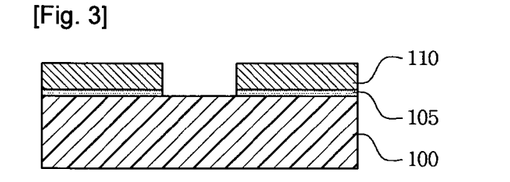

After that, as shown in FIG. 3, an exposed portion of the silicon nitride film 105 through the pattern of the photoresist layer 110 is etched by using a plasma device.

Figure 4:
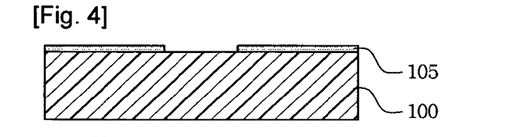

Then, as shown in FIG. 4, an ashing process or a wet strip process is performed to remove the patterned photoresist layer 110. Alternatively, an oxygen plasma process or a process employing a mixture solution of sulfuric acid and hydrogen peroxide can also be performed to remove the photoresist layer 110.

Figure 5:
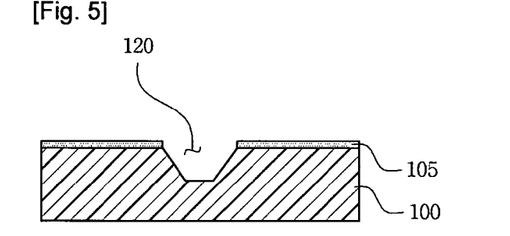

Subsequently, as shown in FIG. 5, the silicon wafer 100 having the silicon nitride film 105 formed thereon is dipped in a solution such as KOH, TMAH or the like capable of performing an anisotropic etching process on the silicon, whereby a trench 120 is formed as the silicon wafer 100 is etched.

Figure 6:
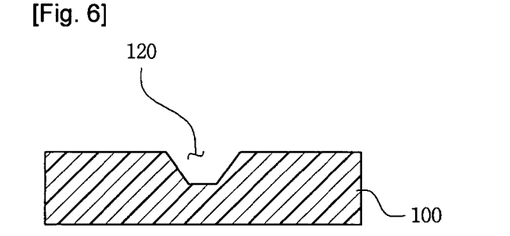

Next, as shown in FIG. 6, the silicon nitride film 105 formed on the silicon wafer 100 is removed by using phosphoric acid or the like.

Figure 7:
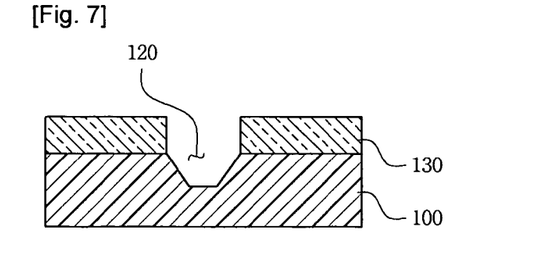

After that, as shown in FIG. 7, a photoresist layer 130 is formed on the entire surface of the silicon wafer 100 except a portion where the trench 120 is formed. Here, the thickness of the photoresist layer 130 determines the thickness of a body of the probe tip to be formed.

Figure 8:
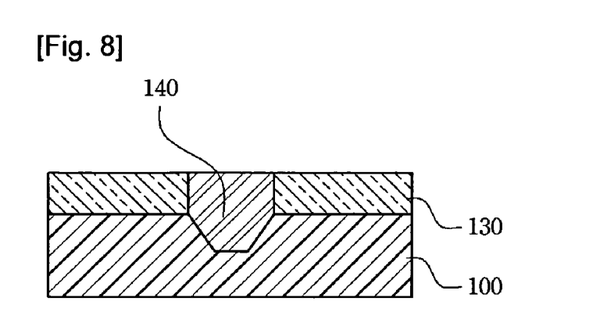

Then, as shown in FIG. 8, the trench 120 and an opening portion of the photoresist layer 130 are coated with Ni or a Ni alloy such as NiCo, NiFe, NiW or the like, so that a probe tip 140 is formed. After the coating process, a chemical mechanical polishing (CMP) process can be additionally performed to planarize the surface of the probe tip.

Figure 9:
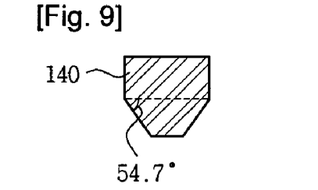

Finally, as shown in FIG. 9, the photoresist layer 130 is removed by performing the ashing process or the wet strip process, and the silicon wafer 100 remaining around the probe tip 140 is removed through a wet etching process so that the formation of the probe tip is completed.

At this time, since the silicon wafer used for fabricating the probe tip is generally a {100} silicon wafer, if the probe tip is fabricated in accordance with the conventional method, the front end of the probe tip would have an angle of only 54.7 degrees for a crystallographic reason.

Figure 10:
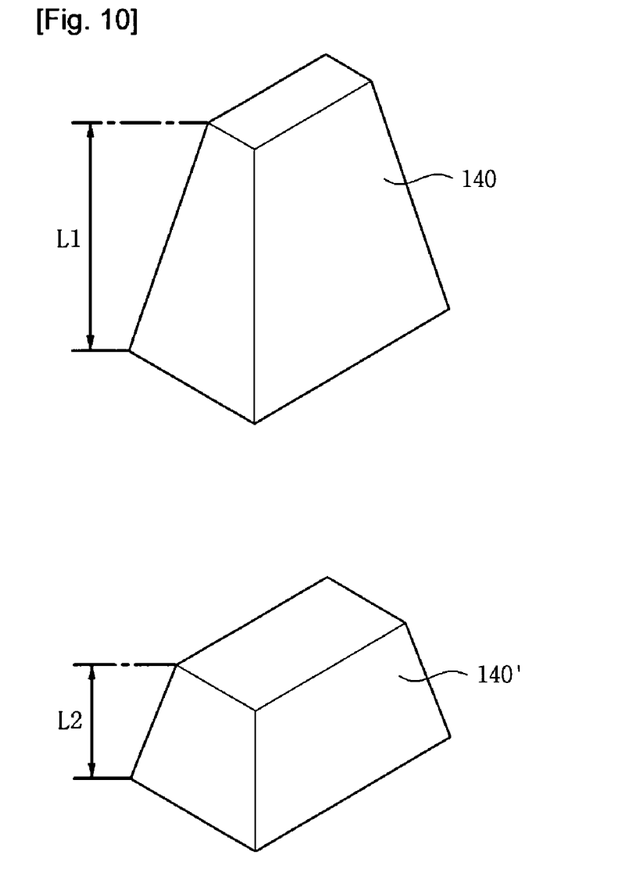
FIG. 10 is a perspective view showing shapes of a probe tip before and after the probe tip is worn out.
Figure 11:
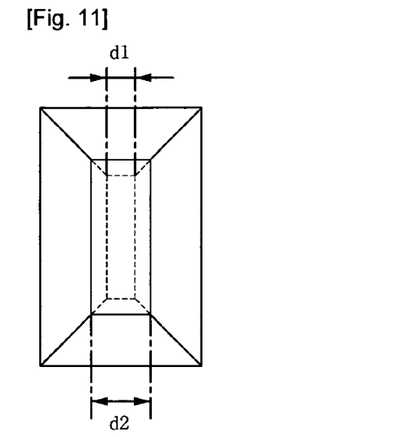
FIG. 11 is a plan view showing a comparison between surface sizes of a front end of a probe tip before and after the probe tip is worn out as shown in FIG. 10.

As a result, as shown in FIGS. 10 and 11, assuming that $\Delta L$ is a difference between an initial height L1 of the front end of the probe tip 140 before worn out and a height L2 of a front end of a worn-out probe tip 140', and $\Delta D$ is a difference between an initial surface size d1 of the front end of the probe tip 140 and a surface size d2 of the front end of the worn-out probe tip 140', $\Delta D/\Delta L$ increases rapidly. That is, the front end surface size of the probe tip rapidly increases as the probe tip is worn out, so that it is difficult to properly keep up with the miniaturization of pads on the wafer and a pitch therebetween. In other words, if the front end of the probe tip is not sharp enough, the problem related to the abrasion of the probe tip would become serious.

Meanwhile, in order to reduce the front end surface size of the probe tip to a predetermined size, a sanding process or other mechanical processes may be performed on the front end portion of the probe tip.

Figure 12:
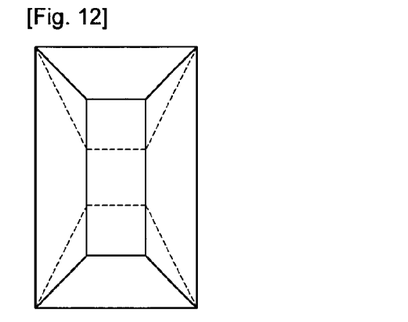
FIG. 12 is a plan view showing shapes of a front end of a probe tip before and after the probe tip is subjected to a machining process.

FIG. 12 is a plan view showing shapes of the front end of the probe tip before and after the probe tip is subjected to a machining process by a mechanical means. As shown in FIG. 12, a rectangular end surface shape of the probe tip can be turned into a square end surface shape through the mechanical process such as the sanding process.

However, in this case, though the surface size of the front end of the probe tip can be reduced, the fabrication accuracy through the sanding process and other mechanical processes notably deteriorates.

Accordingly, it is strongly requested to develop a technology capable of forming a probe tip with a sufficiently sharp front end for a probe card without having to perform the mechanical process such as the sanding process or the like.

DISCLOSURE OF INVENTION

Technical Problem

In view of the foregoing, the present disclosure provides a method for fabricating a probe tip with a front end having a small surface size without having to perform an additional machining process, wherein the angle of the front end of the probe tip can be freely adjusted to prevent a rapid increase of the surface size of the front end of the probe tip due to the abrasion of the probe tip.

Technical Solution

In accordance with an embodiment of the present invention, there is provided a method for fabricating a probe tip, including: forming a front end of the probe tip on a silicon wafer; forming a first protective layer which is patterned to expose a part of the front end of the probe tip; and forming a body of the probe tip in a portion opened by the pattern of the first protective layer.

The step of forming the front end may include: forming a trench in an area of the silicon wafer; and forming the front end of the probe tip on an area of the silicon wafer where the trench is not provided.

The step of forming the trench may include: forming, on the silicon wafer, a second protective layer which is patterned to have an opening corresponding to where the trench is to be formed; etching the silicon wafer by using the patterned second protective layer as a mask to thereby form the trench; and removing the second protective layer.

The step of forming the front end may include: forming, on the silicon wafer, a third protective layer which is patterned to have an opening corresponding to where the front end of the probe tip is to be formed; forming the front end of the probe tip in the opening of the patterned third protective layer; planarizing top surfaces of the third protective layer and the front end of the probe tip; and removing the third protective layer.

MODE FOR THE INVENTION

Hereinafter, embodiments of the present invention will be described in detail with reference to the accompanying drawings so that the present invention may be readily implemented by those skilled in the art. However, it is to be noted that the present invention is not limited to the embodiments but can be realized in various other ways. In the drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element. Further, the term "comprises or includes" and/or "comprising or including" used in the document means that one or more other components, steps, operation and/or existence or addition of elements are not excluded in addition to the described components, steps, operation and/or elements.

Referring to FIGS. 13 to 27, a method for fabricating a probe tip in accordance with an embodiment of the present invention will be described in detail.

FIGS. 13 to 26 are diagrams for describing a procedure for fabricating the probe tip in accordance with the embodiment of the present invention.

Figure 13:
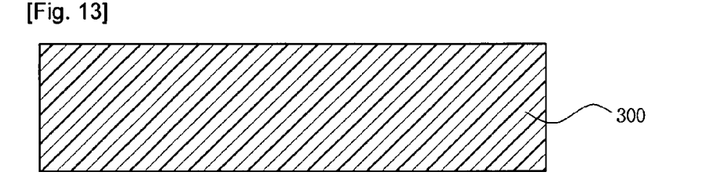
FIGS. 13 to 26 are diagrams for describing a procedure for fabricating a probe tip in accordance with an embodiment of the present invention.
Figure 14:
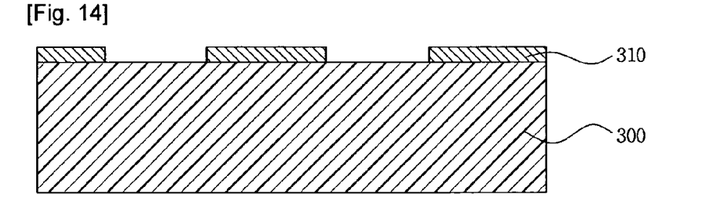

First, as shown in FIGS. 13 and 14, a patterned photoresist layer 310 is formed on a silicon wafer 300. Here, a spin coating method can be employed to form a photoresist layer on the silicon wafer 300, wherein the spin coating method is carried out by spraying and coating photoresist onto the silicon wafer 300 while spinning the silicon wafer 300. The sprayed photoresist is subjected to an exposure process by means of an ultraviolet exposure device or the like, and then a development process is performed on the exposed photoresist layer by using a mask layer (not shown) provided with a predefined pattern for forming a body of the probe tip, so that the patterned photoresist layer 310 is formed.

Figure 15:
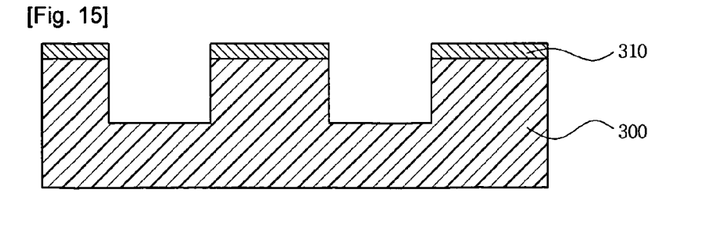

After that, as shown in FIG. 15, a trench is formed by etching the silicon wafer 300 by a predetermined depth while using the patterned photoresist layer 310 as a mask. The etching process for forming the trench can be, for example, a deep silicon reactive ion etching (DRIE) process.

For example, the DRIE process can be implemented by performing a polymer deposition process for 5 seconds, a polymer etching process for the next 3 seconds and then a silicon etching process for the next 5 seconds, sequentially. Here, the silicon etching process is performed in a SF6 gas atmosphere.

At this time, since the thickness of the trench determines the thickness of the body of the probe tip to be formed later, the trench has to be formed thick enough to stand a load applied thereto by a repeated contact between the probe tip and a wafer chip.

Figure 16:
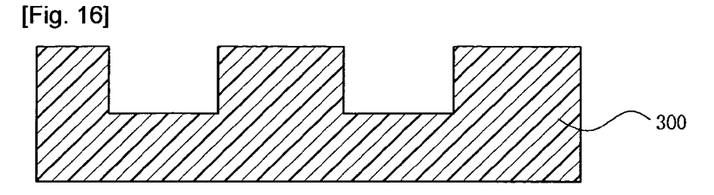

Subsequently, as shown in FIG. 16, the patterned photoresist layer 310 is removed by performing an ashing process or a wet strip process. For example, an oxygen plasma process or a process employing a mixture solution of sulfuric acid and hydrogen peroxide can also be performed to remove the patterned photoresist layer 310.

Figure 17:
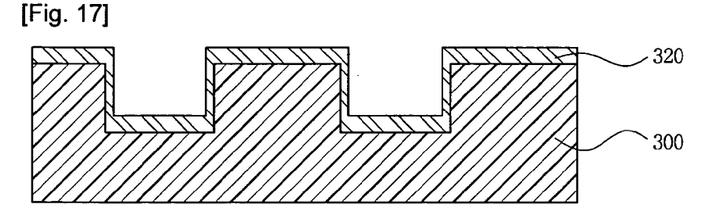

As shown FIG. 17, a seed layer 320 is entirely coated on the top surface of the silicon wafer 300 and on the bottom and side surfaces of the trench. In general, a seed layer serves to facilitate deposition of a coating film in a coating process. That is, if the coating process is performed on the silicon wafer 300 without the seed layer 320, the deposition of the coating film on the silicon wafer 300 would be difficult, and even if deposited, the coating film may be easily separated from the silicon wafer 300. Accordingly, it is more effective to deposit the seed layer 320 on the silicon wafer 300 and then deposit the coating film on the seed layer 320 rather than to directly perform the coating process on the silicon wafer 300.

Ti, Cu, Au or the like can be used as a material for the seed layer 320. The seed layer 320 can be formed by employing a physical vapor deposition method, such as an evaporation method or a sputtering method, which is used in a general semiconductor manufacturing process.

However, it is to be noted that various other materials and methods than those exemplified in the present embodiment can be used to deposit the seed layer 320.

Figure 18:
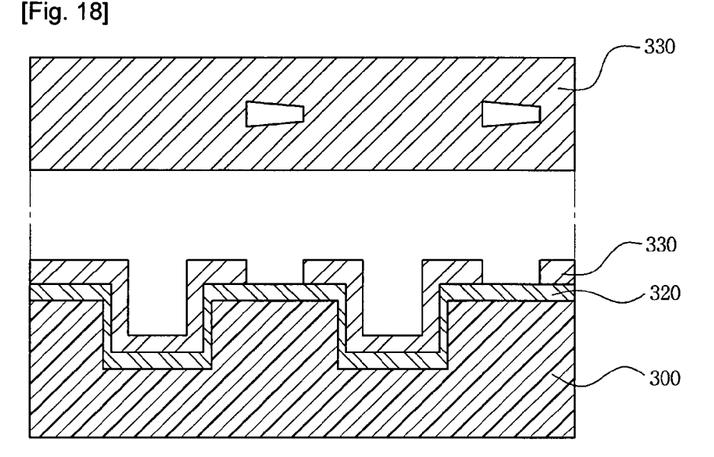

Next, as shown in FIG. 18, a photoresist layer is entirely deposited on the seed layer 320 and a sidewall of the trench, and then an exposure and development process is performed by using a mask having a predetermined pattern, thereby forming a patterned photoresist layer 330.

At this time, the pattern formed on the photoresist layer 330 determines a first coating layer coated by a primary coating process to be described later, wherein the first coating layer forms a front end of the probe tip. Thus, the shape of the front end of the probe tip in accordance with the embodiment of the present invention relies on how the pattern on the photoresist layer 330 is formed. For example, as shown in FIG. 18, a pattern having a trapezoidal shape may be formed.

Figure 19:
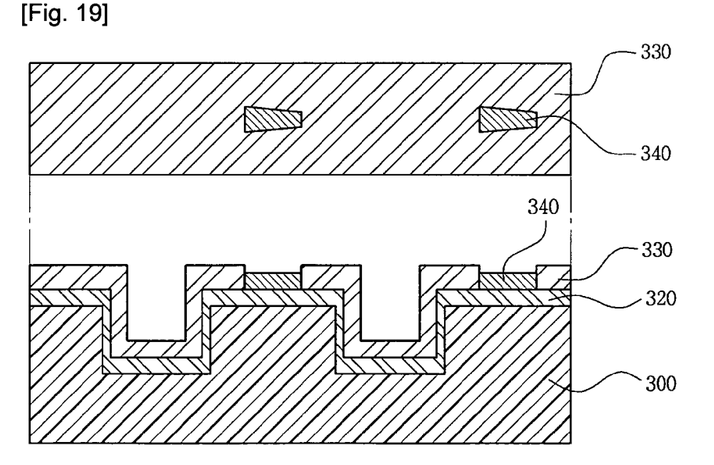

Then, as shown in FIG. 19, the primary coating process is performed by coating Ni or a Ni alloy such as NiCo, NiFe, NiW or the like on the top surface portions of the seed layer 320 opened through the pattern of the photoresist layer 330, thereby forming first coating layers 340. As described above, the first coating layer 340, which is formed by the primary coating process, forms the front end of the probe tip in accordance with the embodiment of the present invention.

Meanwhile, in the embodiment, though the first coating layer 340 (that is, the front end of the probe tip) is formed by using the coating process, it is apparent that various other methods, such as a chemical vapor deposition (CVD) and a physical vapor deposition (PVD), can be used instead.

Figure 20:
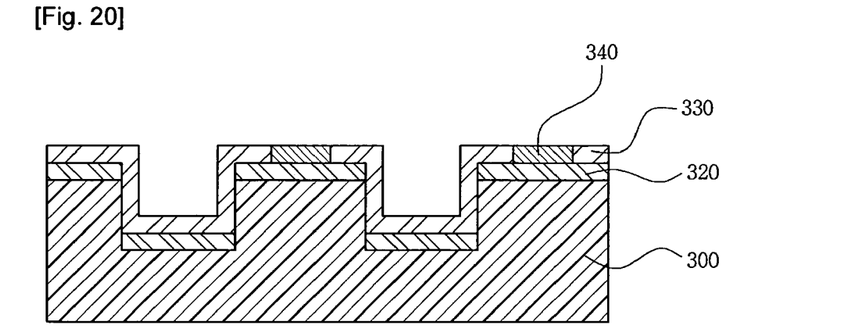

After performing the primary coating process, as shown in FIG. 20, the photoresist layer 330 and the first coating layer 340 are planarized by, for example, a chemical mechanical polishing (CMP) process.

In general, the CMP process is a method for planarizing an oxide film or the like formed on a wafer. In the CMP process, in general, a polishing pad and the wafer are rotated at different RPMs so that they are rubbed against each other while rotating relative to each other, and slurry is supplied between the polishing pad and the wafer so as to accelerate the polishing process.

Figure 21:
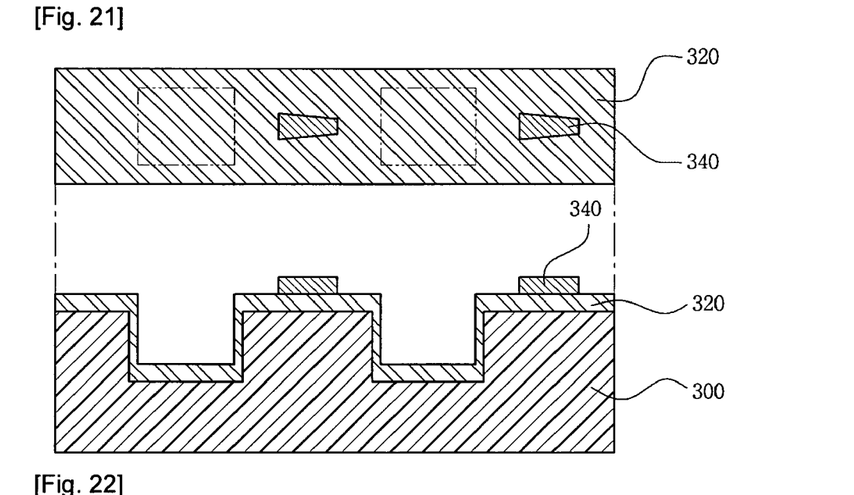

After that, as shown in FIG. 21, the patterned photoresist layer 330 is removed by performing an ashing process or a wet strip process, so that only the first coating layer 340 is left on the top surface of the seed layer 320 to become a front end 340 of the probe tip. As an alternative way to remove the photoresist layer 330, an oxygen plasma process or a process employing the mixture solution of sulfuric acid and hydrogen peroxide can also be performed.

Figure 22:
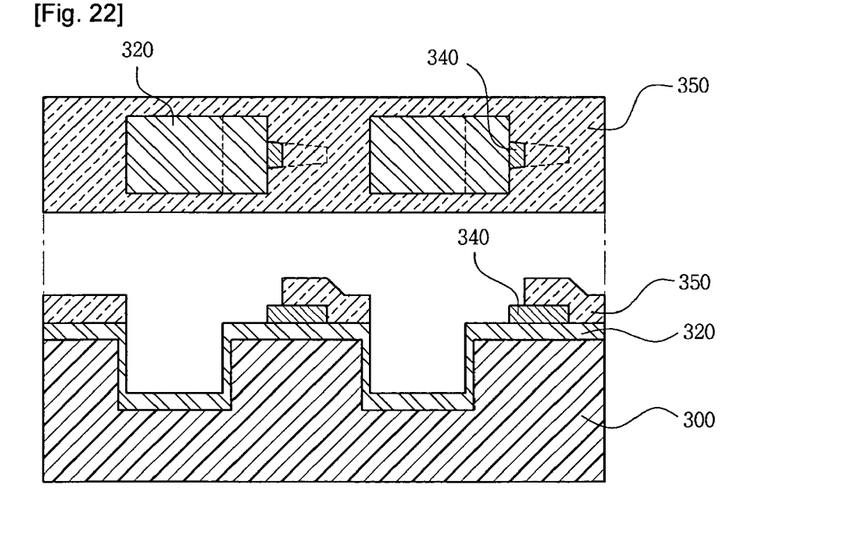

Subsequently, as shown in FIG. 22, a photoresist layer 350 is patterned to cover a part of the top surface of the seed layer 320 and the front end 340 of the probe tip formed by the primary coating process. As described above, this process can be performed through the exposure and development process by using a mask having a predetermined pattern.

At this time, a caution should be taken not to entirely cover the first coating layer 340 with the photoresist layer 350. The reason for this is that the first coating layer 340 has to be grown by a secondary coating process to form the body of the probe tip.

In addition, since the thickness of the photoresist layer 350 exerts an influence upon the thickness of the body of the probe tip to be formed later, the photoresist layer 350 has to be thick enough so as to stand the load applied thereto by the repeated contact between the probe tip and the wafer chip. In the embodiment of the present invention, the thickness of the photoresist layer 350 is formed larger than that of the first coating layer 340. However, it may be also possible to form the thickness of the photoresist layer 350 equal to that of the first coating layer 340.

Figure 23:
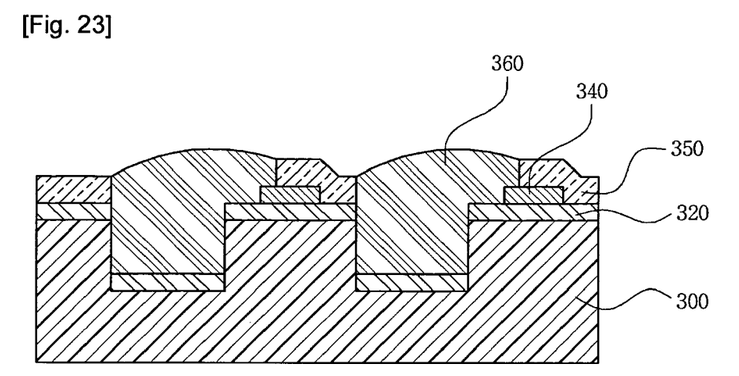

After that, as shown in FIG. 23, the secondary coating process is performed by coating Ni or a Ni alloy such as NiCo, NiFe, NiW or the like onto the top surface of the seed layer 320 formed on the bottom surface of the trench and onto the top surface of the first coating layer 340 a part of which is covered with the photoresist layer 350, whereby a second coating layer 360 is formed. The second coating layer 360, which is formed by the secondary coating process, later forms the body of the probe tip in accordance with the embodiment of the present invention.

If the material used in the secondary coating process is the same as the material used in the primary coating process, that is, if the material of the second coating layer 360 is the same as that of the first coating layer 340, the portion of the first coating layer 340 that is not covered with the photoresist layer 350 is grown through the secondary coating process, thereby forming the second coating layer 360.

Meanwhile, though the materials used in the primary and secondary coating processes are the same in the embodiment of the present invention, the materials may be different from each other if necessary.

Figure 24:
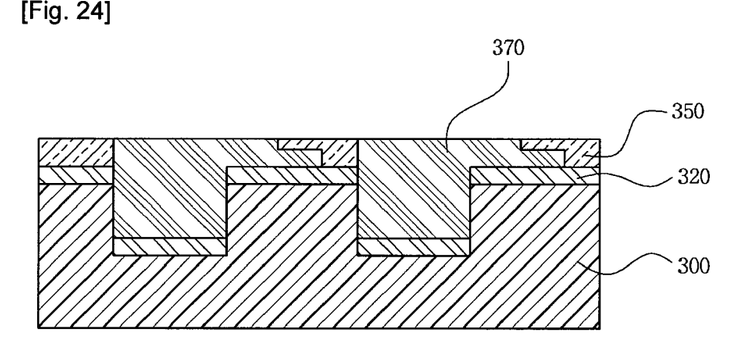

As shown in FIG. 24, after performing the secondary coating process, a surface including the front end 340 and the body 360 of the probe tip is planarized by the CMP process, thereby finally obtaining a probe tip 370.

Figure 25:
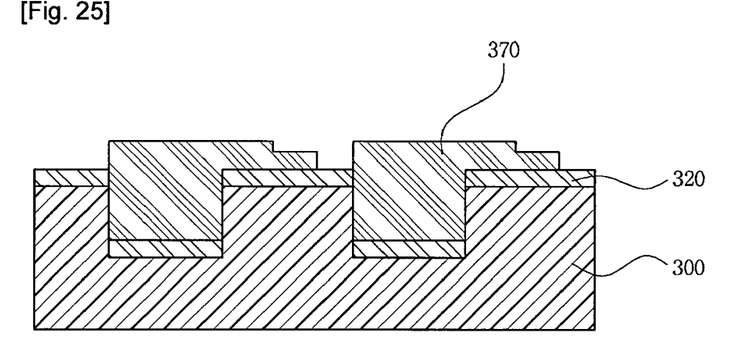
Figure 26:
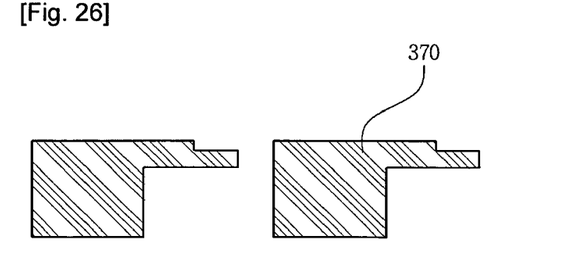

Next, as shown in FIGS. 25 and 26, an ashing process or a wet strip process is performed to remove the planarized photoresist layer 350.

After that, the seed layer 320 and the silicon wafer 300 are removed by a wet etching process, thereby obtaining the probe tip 370.

In the embodiment of the present invention as described above, though only the primary and secondary coating processes are performed, an additional coating process can be performed according to a desired thickness and a desired shape of the probe tip to be formed.

Figure 27:
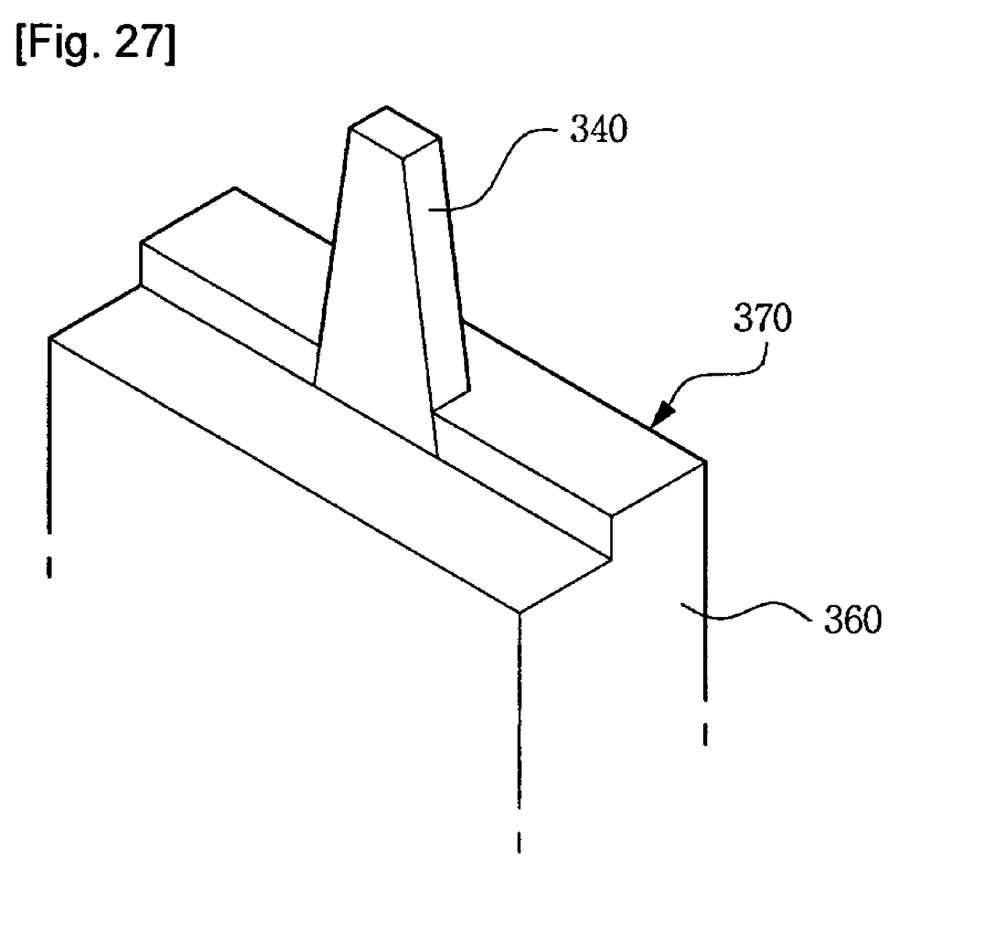
FIG. 27 is a perspective view of a probe tip fabricated in accordance with the embodiment of the present invention.

FIG. 27 is a perspective view of the probe tip 370 fabricated in accordance with the embodiment of the present invention.

As described above, the probe tip 370 includes the front end 340 and the body 360, wherein the front end 340 is made of the first coating layer formed by the primary coating process and the body 360 is made of the first coating layer formed by the secondary coating process.

As shown in FIG. 27, in accordance with the embodiment of the present invention, the shape of the front end 340 of the probe tip is not determined according to a crystal plane of the silicon wafer 300 as is in the prior art, but can be fabricated to have a desired shape according to the opening pattern of the photoresist layer 330 regardless of the crystal plane of the silicon wafer 300.

Thus, since the angle of the front end 340 of the probe tip can be freely adjusted, it is possible to solve the problem that the surface size of the front end 340 of the probe tip rapidly increases as the probe tip is worn out, by means of forming the front end 340 of the probe tip as sharply as required.

Moreover, the front end 340 and the body 360 of the probe tip can be fabricated to have different thicknesses through the primary and secondary coating processes.

Accordingly, if the thickness of the body 360 of the probe tip is properly adjusted so that the body 360 can stand the load applied thereto by the repeated contact between the probe tip and the wafer chip during a semiconductor chip testing process, the front end 340 of the probe tip can be microscopically fabricated without concerning the load.

In addition, since the shape of the front end 340 of the probe tip is determined according to the pattern on the photoresist layer 330, if the pattern on the photoresist layer 330 is adjusted as required, the probe tip having a microscopic size can be fabricated without having to perform a sanding process or an additional mechanical process.

The above description of the present invention is provided for the purpose of illustration, and it would be understood by those skilled in the art that various changes and modifications may be made without changing technical conception and essential features of the present invention. Thus, it is clear that the above-described embodiments are illustrative in all aspects and do not limit the present invention.

The scope of the present invention is defined by the following claims rather than by the detailed description of the embodiment. It shall be understood that all modifications and embodiments conceived from the meaning and scope of the claims and their equivalents are included in the scope of the present invention.

INDUSTRIAL APPLICABILITY

In accordance with the above-described embodiment of the present invention, it is possible to fabricate a probe tip having a front end whose surface size can be prevented from increasing rapidly even when the probe tip is worn out.

In addition, since a sanding process or an additional machining process is not performed, a probe tip having a superior precision can be fabricated.

Moreover, it is possible to form a probe tip having a fine front end capable of standing a load applied thereto by a frequent contact with a wafer chip can be fabricated.

The invention claimed is:

1. A method for fabricating a probe tip, comprising:
    forming a front end of the probe tip on a silicon wafer;
    forming a first protective layer which is patterned to expose a part of the front end of the probe tip; and
    forming a body of the probe tip in a portion opened by the pattern of the first protective layer
    wherein the step of forming the front end includes:
    forming a trench in a portion of the silicon wafer; and
    forming the front end of the probe tip on other portion than the trench is formed.

2. The method of claim 1, further including, after the step of forming the trench, forming a seed layer on a top surface of the silicon wafer provided with the trench and on the entire bottom surface of the trench.

3. The method of claim 1, wherein the first protective layer is a photoresist layer.

4. The method of claim 1, wherein the front end of the probe tip is made of Ni or a Ni alloy.

5. The method of claim 1, wherein the step of forming the trench is performed by a deep silicon reactive ion etching process.

6. The method of claim 1, wherein the front end of the probe tip is made of the same material as a material for the body of the probe tip.

7. The method of claim 6, wherein the body of the probe tip is formed by growing the front end of the probe tip.

8. The method of claim 1, wherein the front end of the probe tip is made of a material different from a material for the body of the probe tip.

9. The method of claim 8, wherein the body of the probe tip is formed by growing the front end of the probe tip.

10. The method of claim 1, wherein the step of forming the trench includes:
    forming, on the silicon wafer, a second protective layer which is patterned to have an opening corresponding to where the trench is to be formed;
    etching the silicon wafer by using the patterned second protective layer as a mask to thereby form the trench; and
    removing the second protective layer.

11. The method of claim 10, wherein the second protective layer is a photoresist layer.

12. The method of claim 10, wherein the second protective layer is removed by an ashing process or a wet strip process.

13. The method of claim 1, further comprising, after the step of forming the body, planarizing top surfaces of the body of the probe tip and the first protective layer, and removing the resultant structure except for the front end and the body of the probe tip.

14. The method of claim 13, wherein the planarization process is performed by a chemical mechanical polishing process.

15. The method of claim 13, the first protective layer is removed by an ashing process or a wet strip process.

16. The method of claim 1, wherein the step of forming the front end includes:
    forming, on the silicon wafer, a third protective layer which is patterned to have an opening corresponding to where the front end of the probe tip is to be formed;
    forming the front end of the probe tip in the opening of the patterned third protective layer;
    planarizing top surfaces of the third protective layer and the front end of the probe tip; and
    removing the third protective layer.

17. The method of claim 16, wherein the third protective layer is a photoresist layer.

18. The method of claim 16, wherein the planarization process is performed by a chemical mechanical polishing process.

19. The method of claim 16, wherein the third protective layer is removed by an ashing process or a wet strip process.

* * * * *